United States Patent
Yasue

(10) Patent No.: US 7,295,900 B2
(45) Date of Patent: Nov. 13, 2007

(54) LOAD DRIVE APPARATUS WITH SHORT CIRCUIT DETERMINATION

(75) Inventor: Satoka Yasue, Kariya (JP)

(73) Assignee: Denso Corporation, Kariya, Aichi-pref. (JP)

( * ) Notice: Subject to any disclaimer, the term of this patent is extended or adjusted under 35 U.S.C. 154(b) by 12 days.

(21) Appl. No.: 11/411,948

(22) Filed: Apr. 27, 2006

(65) Prior Publication Data

US 2006/0245123 A1   Nov. 2, 2006

(30) Foreign Application Priority Data

Apr. 28, 2005   (JP)   ............................. 2005-132210

(51) Int. Cl.
*G06F 19/00* (2006.01)
*H02P 9/16* (2006.01)

(52) U.S. Cl. ...................... 700/296; 700/297; 307/100; 322/83

(58) Field of Classification Search ................ 700/296, 700/297; 307/100; 322/83
See application file for complete search history.

(56) References Cited

U.S. PATENT DOCUMENTS

| | | | |
|---|---|---|---|
| 5,675,297 A | | 10/1997 | Gose et al. |
| 5,724,235 A | * | 3/1998 | Shimamori et al. ....... 363/21.06 |
| 5,952,740 A | * | 9/1999 | Maeda et al. ................ 307/130 |
| 6,212,051 B1 | * | 4/2001 | King ........................... 361/94 |
| 6,233,396 B1 | * | 5/2001 | Kuwada et al. ............. 388/811 |
| 2004/0155616 A1 | * | 8/2004 | Iribe et al. ................... 318/432 |
| 2005/0083066 A1 | | 4/2005 | Tani et al. |
| 2005/0151424 A1 | * | 7/2005 | Hirosue ....................... 307/11 |
| 2007/0018656 A1 | * | 1/2007 | Yasue ........................ 324/509 |

FOREIGN PATENT DOCUMENTS

| | | |
|---|---|---|
| EP | 1463203 A2 | 9/2004 |
| JP | 59-028674 | 2/1984 |
| JP | 09-196991 | 7/1997 |
| JP | 2005-121433 | 5/2005 |

OTHER PUBLICATIONS

"PWM Control 2A Step-Down Converter", Anachip Corporation, Apr. 2005.*
EPO Search Report and Opinion dated Aug. 7, 2006.

* cited by examiner

*Primary Examiner*—Michael D. Masinick
(74) *Attorney, Agent, or Firm*—Nixon & Vanderhye P.C.

(57) ABSTRACT

The load drive apparatus has a driver unit and a control unit. The driver unit includes a control section modulating, in accordance with a PWM signal supplied from the control unit, a drive signal to be applied to a load apparatus between a high level and a low level, and a short circuit detecting section detecting, on the basis of a signal level of the PWM signal and a signal level of the modulated drive signal, short circuit on a path through which the modulated drive signal is applied to the load apparatus. The control unit includes a function of fixing a duty ratio of the PWM signal upon occurrence of short circuit to determine to which of a high-level side and a low-level side the path is short-circuited.

6 Claims, 6 Drawing Sheets

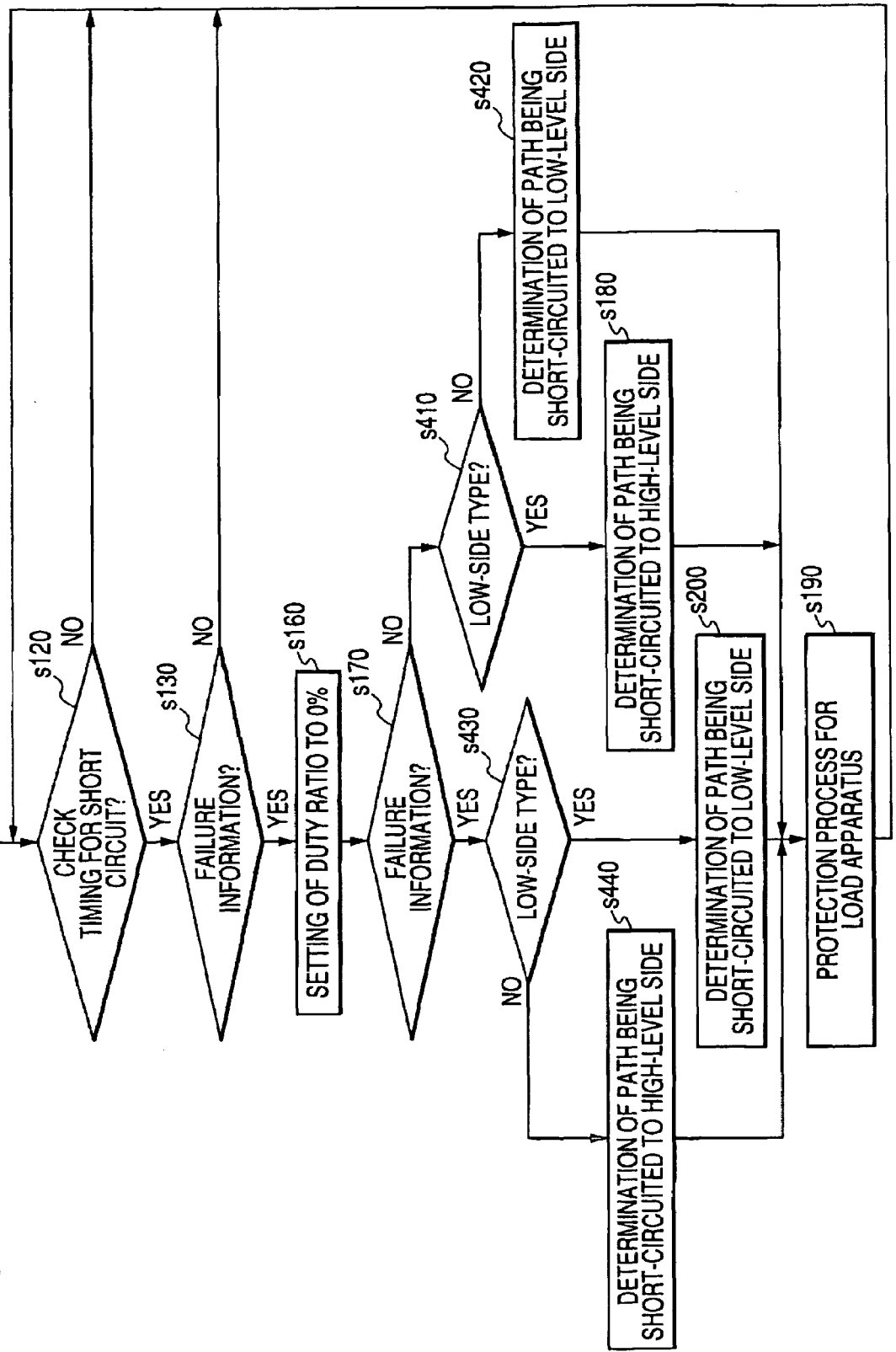

LOAD DRIVE APPARATUS WITH SHORT CIRCUIT DETERMINATION

CROSS-REFERENCE TO RELATED APPLICATION

This application is related to Japanese Patent Application No. 2005-132210 filed on Apr. 28, 2005, the contents of which are hereby incorporated by reference.

BACKGROUND OF THE INVENTION

1. Field of the Invention

The present invention relates to a load drive apparatus having a function of pulse-width modulating a drive signal applied to a load apparatus to be controlled.

2. Description of Related Art

It is known to detect occurrence of a short circuit on a path for connection between a load apparatus and a load drive apparatus that has a switching element for PWM-modulating (pulse-width modulating) a drive signal applied to the load apparatus through this path in accordance with a PWM signal by monitoring the state (voltage level) of the path. If the monitored state does not change when the drive signal is being PWM-modulated in accordance with the PWM signal, it can be determined that a short circuit has occurred on the path. For detail, refer to Japanese Patent Application Laid-open No. 09-196991.

That is because, if the path is short-circuited to a high level side (to a power supply side), the monitored state is fixed at a high level, and if the path is short-circuited to a low level side (to a ground side), the monitored state is fixed at a low level.

It is a matter of course that it can be determined to which side the path has been short-circuited from the monitored state.

Incidentally, in recent years, the switching element is being replaced by a driver unit constituted by a general-purpose IC in order to reduce production costs and to provide additional functions other than the switching function.

However, although such a driver unit can detect occurrence of a short circuit, it cannot determine to which side the path has been short-circuited because of the standardized circuit design of the general-purpose IC. To provide the driver unit with the capability of determining to which side the path has been short-circuited, it is necessary to replace the general-purpose IC with a custom-designed IC. This increases the production costs of the load drive apparatus.

SUMMARY OF THE INVENTION

The present invention provides a load drive apparatus including:

a driver unit having:
a control section modulating, in accordance with a PWM signal, a drive signal to be applied to a load apparatus between a high level and a low level;
a short circuit detecting section detecting, on the basis of a signal level of the PWM signal and a signal level of the modulated drive signal, short circuit on a path through which the modulated drive signal is applied to the load apparatus; and
a notification section making, on the basis of detection result of the short circuit detecting section, notification whose content represents presence or absence of short circuit on the path; and a control unit generating the PWM signal on the basis of a control program stored therein;
wherein the control unit includes a first function of fixing a duty ratio of the PWM signal at one of 0% and 100% when content of the notification made by the notification section represents presence of short circuit on the path, and a second function of determining to which of a high-level side and a low-level side the path is short-circuited on the basis of content of notification made by the notification section after a duty ratio of the PWM signal is fixed by the first function.

The control section of the driver unit may function as a low-side type driver circuit, and the second function of the control unit may determine that the path is short-circuited to a side opposite to a signal level of the PWM signal when content of notification made by the notification section represents absence of short circuit on the path after a duty ratio of the PWM signal is fixed by the first function, and to determine that the path is short-circuited to the same side as a signal level of the PWM signal when content of notification made by the notification section represents presence of short circuit on the path after a duty ratio of the PWM signal is fixed by the first function.

The control section of the driver unit may function as a high-side type driver circuit, and the second function of the control unit may determine that the path is short-circuited to the same side as a signal level of the PWM signal when content of notification made by the notification section represents absence of short circuit on the path after a duty ratio of the PWM signal is fixed by the first function, and to determine that the path is short-circuited to a side opposite to a signal level of the PWM signal when content of notification made by the notification section represents presence of short circuit on the path after a duty ratio of the PWM signal is fixed by the first function.

The control unit may include a configuration registration memory storing information representing whether the control section of the driver unit functions as a high-side type driver circuit or a low-side type driver circuit.

According to the present invention, it is possible to provide a load drive apparatus capable of determining to which of the high-level side and the low-level side the path for connection between the driver unit thereof and a load apparatus has been short-circuited at low costs, because the driver unit can be constituted by a general-purpose IC.

BRIEF DESCRIPTION OF THE DRAWINGS

In the accompanying drawings:

FIG. 7 is a flowchart showing operation of a load drive apparatus according to a third embodiment of the invention.

PREFERRED EMBODIMENTS OF THE INVENTION

Figure 1:
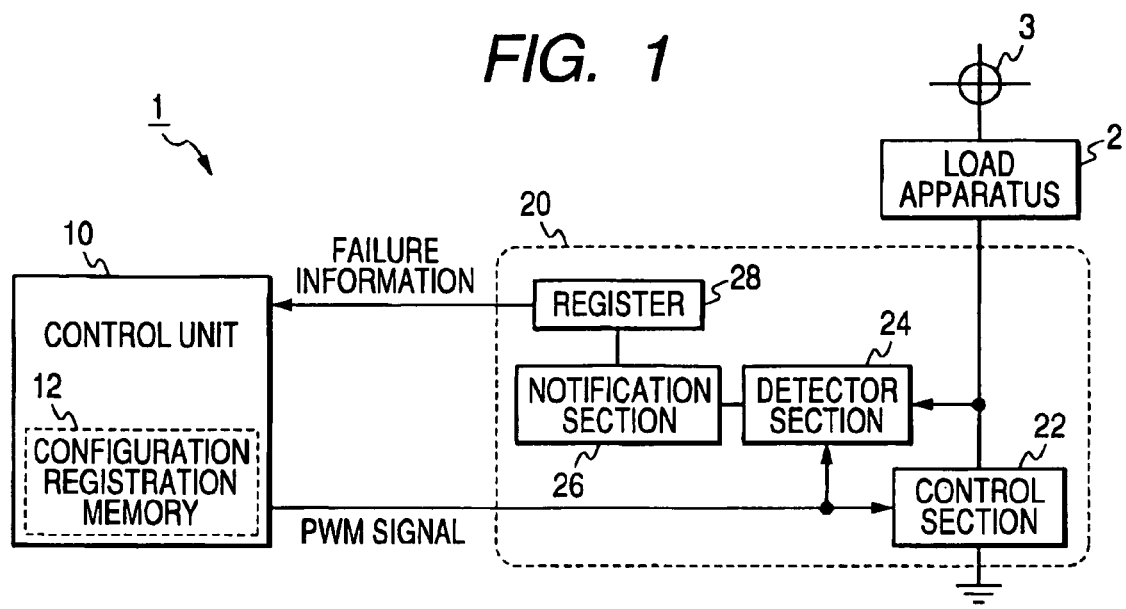
FIG. 1 is a diagram showing a structure of a load drive apparatus according to a first embodiment of the invention.

FIG. 1 is a diagram showing a structure of a load drive apparatus 1 according to a first embodiment of the invention. As shown in this figure, the load drive apparatus 1, which is for driving a load apparatus 2 (an inductance load such as a motor and a solenoid) is constituted by a control unit 10 and a driver unit 20.

The control unit 10 has a memory in which a program for controlling the operation of the load apparatus 2 is stored. The control unit 10 is configured to generate a PWM signal on the basis of the stored program, supply the generated PWM signal to the driver unit 20, and perform, when a short circuit has occurred, a specific process (to be described later) for determining details of the short circuit.

The driver unit 20 is constituted by an IC chip including therein a control section 22 for modulating in accordance with the PWM signal supplied from the control unit 10 a drive signal to be applied to the load apparatus 2 through a path for connection between the load apparatus 2 and the control section 22, a detector section 24 for detecting occurrence of short circuit on the path, and a notifying section 26 for making notification to the outside of occurrence of short circuit.

The control section 22 includes a switching element connected between one end (low-voltage side) of the path and the ground. The other end of the path is connected to a power supply 3 through the load apparatus 2. The switching element is closed and opened depending on the PWM signal supplied form the control unit 10. Accordingly, the control unit 20 functions as a low-side type driver circuit. The detector section 24 includes a comparator for comparing the signal level of the PWM signal supplied from the control unit 10 with the signal level of the drive signal modulated in accordance with the PWM signal (or the voltage level of the path). If these signal levels are in a relationship to be satisfied when the drive signal is PWM-modulated normally, the detector section 24 decides that there is no short circuit on the path. On the other hand, if these signal levels are not in the relationship to be satisfied when the drive signal is PWM-modulated normally, the detector section 24 decides that a short circuit on the path has occurred. When the detector section 24 decides that the load apparatus 2 is controlled normally, the notifying section 26 writes safe information into a data-queue type register 28, and when the detector section 24 decides that there exists a short circuit on the path, the notifying section 26 writes failure information into the register 28, so that the detection results of the detector section 24 can be notified to the outside.

Figure 2:
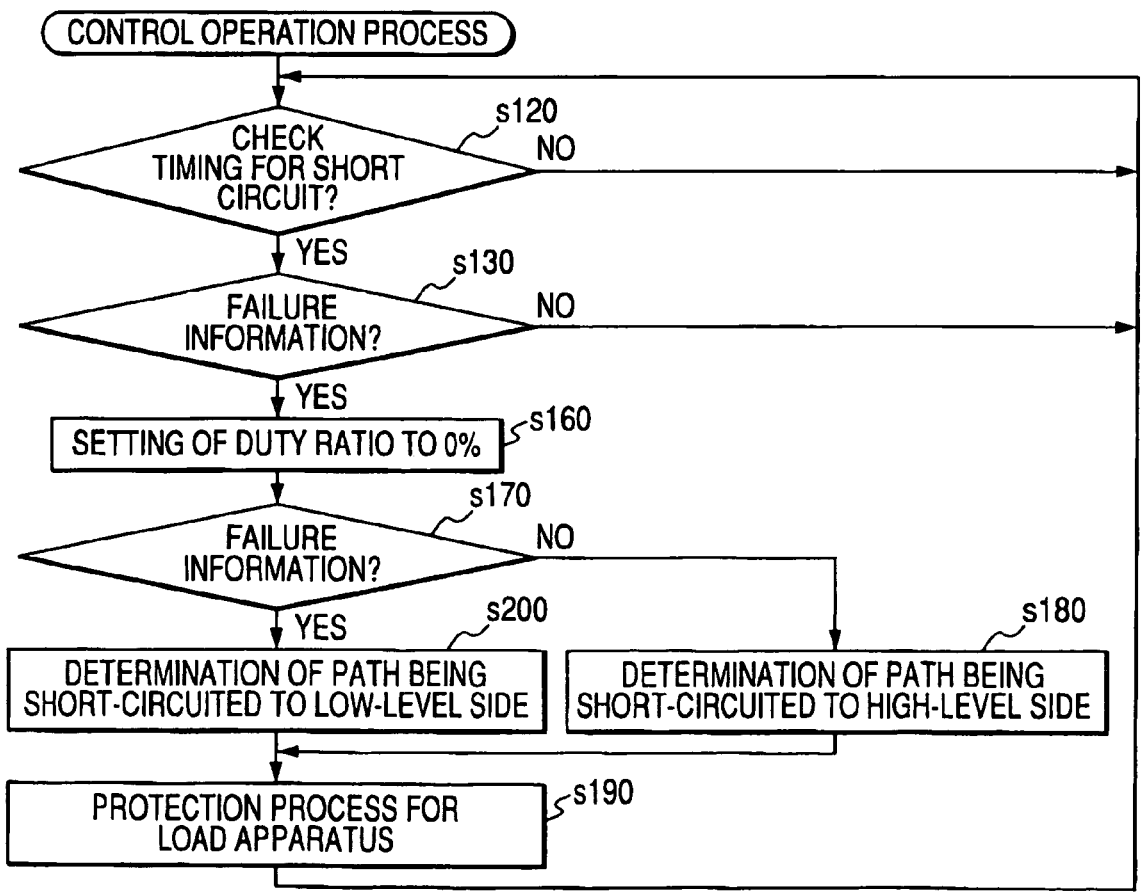
FIG. 2 is a flowchart showing operation of the load drive apparatus.

Next, the operation control process performed by the control unit 10 is explained with reference to a flowchart shown in FIG. 2. This operation control process is performed for applying the load apparatus 2 with the drive signal having a duty ratio necessary for driving the load apparatus by use of the PWM signal.

After initiation of the control on the load apparatus 2 by the drive signal which the control section 22 of the driver unit 20 modulates in accordance with the PWM signal, the process waits for the timing at which occurrence of a short circuit on the path leading from the driver unit 20 to the load apparatus 2 should be checked (NO in step s120). In this embodiment, it is checked whether or not the failure information has been written into the register 8 at regular intervals after the PWM signal is started to be supplied to the driver unit 20. Accordingly, the process moves from step s120 to step s130 (YES in step s120) to check occurrence of a short circuit at these intervals.

If it is found at step s130 that the information read from the register 28 of the driver unit 20 is the safe information (NO in step s130), the process returns to step s120, since it means there exists no short circuit on the path.

On the other hand, if it is found at step s130 that the information read from the register 28 of the driver unit 20 is the failure information (YES in step s130), the process moves to step s160, where the duty ratio of the PWM signal is fixed at 0%, that is, the signal level of the PWM signal is fixed at the low level.

After that, the process moves to step s170 where the information stored in the register 28 of the driver unit 20 is read again, and it is checked whether or not this information is still the failure information.

If the information read from the register 28 of the driver unit 20 is not the failure information (NO in step s170), it is determined at step s180 that the path is short-circuited to the high-level side.

Figure 3A:
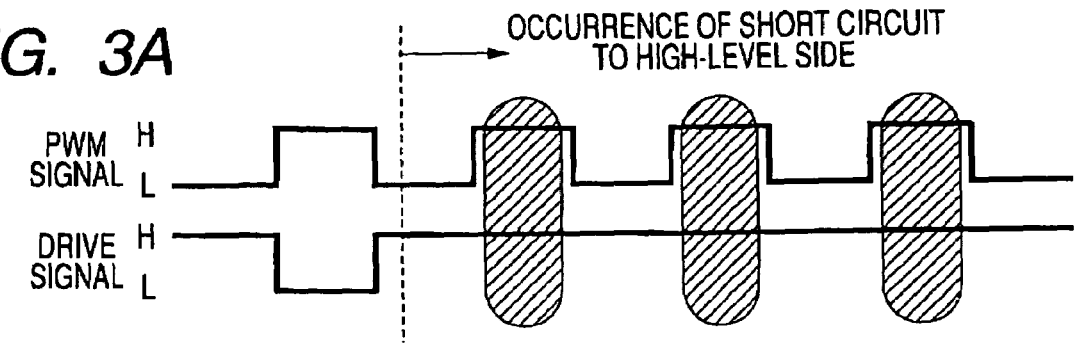
FIG. 3A is a diagram showing waveforms of a PWM signal and a drive signal in the first embodiment when a short circuit to the high-level side has occurred on a path for connection between a driver unit of the load drive apparatus and a load apparatus.

Since the control section 22 of the driver unit 20 functions as a low-side type driver circuit, if the path 2 is short-circuited to the high-level side (to the side of the power supply 3), the path 2 is fixed at the high-level side irrespective of the signal level of the PWM signal, and accordingly, the signal level of the drive signal on the path 2 does not become the low level even in a period during which the PWM signal is in the high level (see the shaded areas in FIG. 3A). Accordingly, in such a state, if the duty ratio of the PWM signal is fixed at 0% at step s160, the signal levels of the PWM signal received from the control unit 10 and the drive signal PWM-modulated by the control section 22 are in the relationship to be satisfied when the drive signal is normally PWM-modulated where they have opposite levels. Hence, in such a state, the detector section 24 of the driver unit 20 does not detect any short circuit, and accordingly the failure information is not written into the register 28. For such reason, if the information read from the register 28 after the duty ratio of the PWM signal is fixed at 0% at step s160 is not the failure information, it means that the path is short-circuited to the high-level side, or to the opposite side of the signal level of the PWM signal. Hence, at step s180, it is determined that the path is short-circuited to the high-level side.

After it is determined that the path is short-circuited to the high-level side, the process moves to step s190 where a processing for protecting the load apparatus 2 is performed, and then returns to step s120. More specifically, at step s190, notification as to which side the path has been short-circuited is made for necessary restoration, and application of the drive signal to the load apparatus 2 is stopped.

On the other hand, if the information read from the register 28 of the driver unit 20 at step s170 is the failure information, it is determined at step s200 that the path is short-circuited to the low-level side.

Figure 3B:
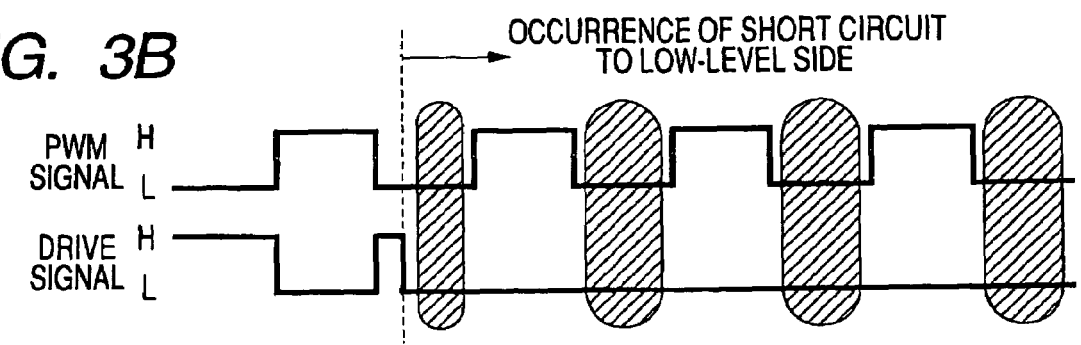
FIG. 3B is diagram showing waveforms of the PWM signal and the drive signal in the first embodiment when a short circuit to the low-level side has occurred on the path.

Since the control section 22 of the driver unit 20 functions as a low-side type driver circuit, if the path 2 is short-circuited to the low-level side (to the ground side), the path 2 is fixed at the low-level side irrespective of the signal level of the PWM signal, and accordingly, the drive signal on the path 2 does not become the high-level even in a period during which the PWM signal is in the low level (see the shaded areas in FIG. 3B). Accordingly, in such a state, if the duty ratio of the PWM signal is fixed at 0% at step s160, the signal levels of the PWM signal received from the control unit 10 and the drive signal PWM-modulated by the control section 22 are in a relationship (where the PWM signal and the drive signal have the same signal level) different from the relationship to be satisfied when the drive signal is PWM-modulated normally where they have opposite levels. Hence, in such a state, the detector section 24 of the driver unit 20 detects a short circuit, and the failure information is written into the register 28. For such reason, if the information read from the register 28 after the duty ratio of the PWM signal is fixed at 0% at step s160 is the failure information, it means that the path is short-circuited to the low-level side, or to the side of the signal level of the PWM signal. Hence, at step s200, it is determined that the path is short-circuited to the low-level side.

After that, the process moves to step s190 where the processing for protecting the load apparatus 2 is performed, and then returns to step s120. As described above, the control unit 10 is capable of determining, when a short circuit has occurred on the path for connection between the load apparatus 2 and the driver unit 20, to which side the path has been short-circuited on the basis of the contents of the notification sent from the driver unit 20 before and after the duty ratio of the PWM signal supplied to the driver unit 20 is fixed. It is a matter of course that various modifications can be made to this embodiment of the invention as described below.

Although the duty ratio of the PWM signal is fixed at 0% at step s160 in this embodiment, it may be fixed at 100% at step s160.

Although this embodiment is so configured that the notifying section 26 writes the failure information into the register 28 to make notification of short circuit being detected by the detector section 24, it may have a different configuration in which the detector section 24 outputs a specific notification signal indicative of occurrence of a short circuit to the outside (to the control unit 10) while the short circuit is being detected. In this case, the process begins at step S130 without performing step s120 to check whether or not the driver unit 20 is outputting the notification signal to the control unit 10.

Second Embodiment

Figure 4:
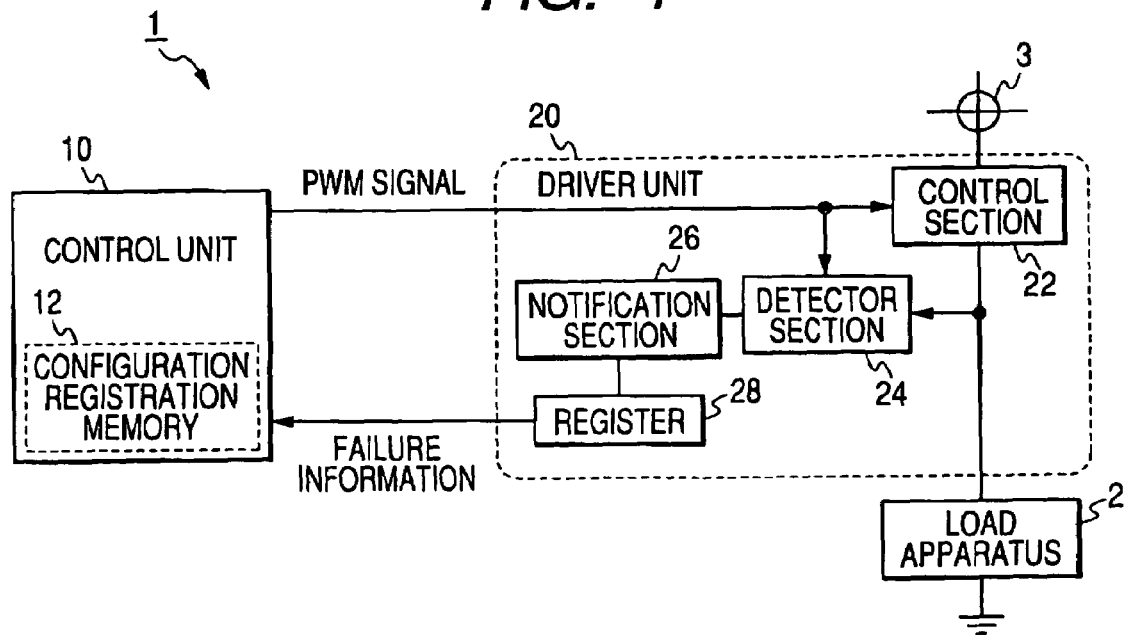
FIG. 4 is diagram showing a structure of a load drive apparatus according to a second embodiment of the invention.

Although the control section 22 of the driver unit 20 functions as a low-side driver circuit in this embodiment, the control section 22 may be configured as a high-side driver circuit as shown in FIG. 4, in which the switching element of the control section 22 is connected between the power supply 3 and one end of the path, the switching element being closed and opened depending on the PWM signal supplied form the control unit 10.

Figure 5:
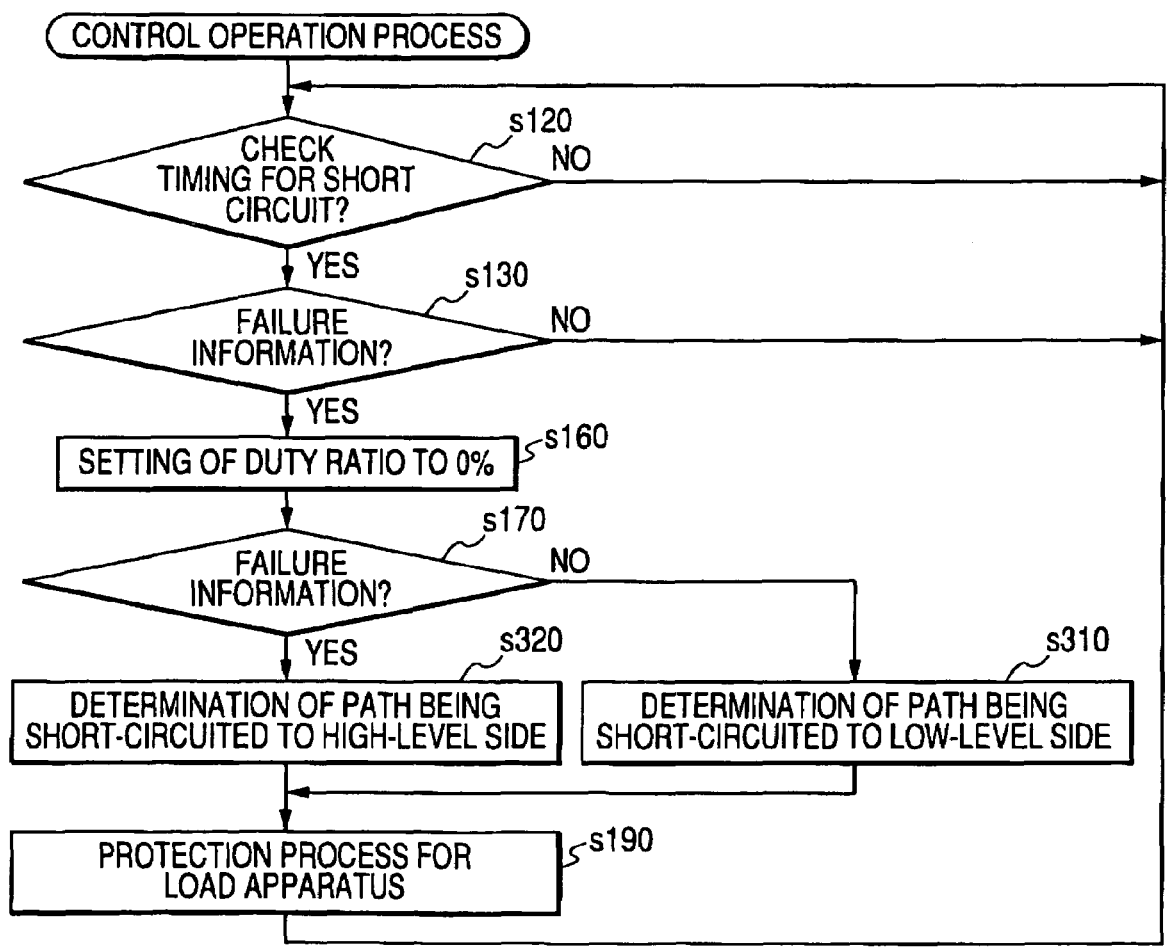
FIG. 5 is a flowchart showing operation of the load drive apparatus according to the second embodiment of the invention.

In this case, as shown in the flowchart of FIG. 5, if the information read from the register 28 is not the failure information (NO in step s170), it is determined at step s310 that the path 2 has been short-circuited to the low-level side, that is, to the side of the signal level of the PWM signal. On the other hand, if the information read from the register 28 is the failure information (YES in step s170), it is determined at step s320 that the path 2 has been short-circuited to the high-level side, that is, to the side opposite to the signal level of the PWM signal.

Figure 6A:
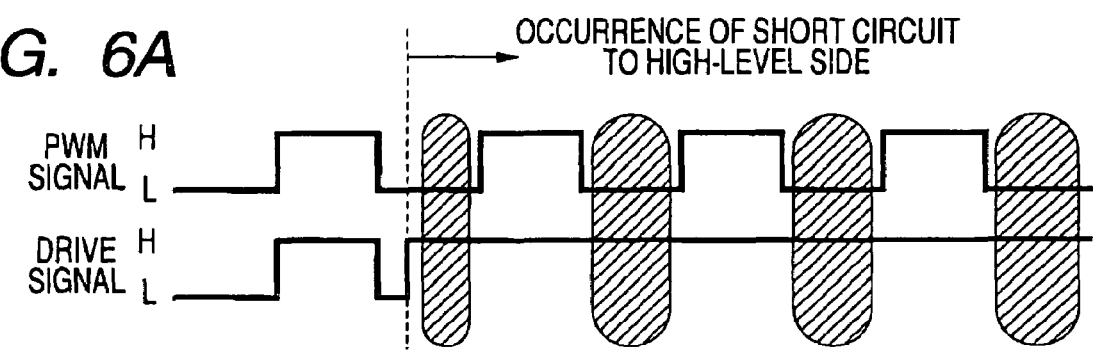
FIG. 6A is a diagram showing waveforms of a PWM signal and a drive signal in the second embodiment when a short circuit to the high-level side has occurred on a path for connection between a driver unit of the load drive apparatus and a load apparatus.

When the control section 22 of the driver unit 20 functions as a high-side type driver circuit, if the path leading from the driver unit 20 to the load apparatus 2 is short-circuited to the high-level side (to the power supply 3 side), the path is fixed at the high-level side irrespective of the signal level of the PWM signal, and accordingly, the drive signal on the path does not become the low level even in a period during which the PWM signal is in the low level (see the shaded areas in FIG. 6A). Accordingly, if the duty ratio of the PWM signal is fixed at 0% at step s160, the signal levels of the PWM signal received from the control unit 10 and the drive signal PWM-modulated by the control section 22 are in a relationship (where the PWM signal and the drive signal have opposite signal levels) different from the relationship when the drive signal is normally PWM-modulated where they have the same level. Hence, in such a state, the detector section 24 of the driver unit 20 detects a short circuit, and the failure information is written into the register 28. For such reason, if the information read from the register 28 after the duty ratio of the PWM signal is fixed at 0% at step s160 is the failure information, it means that the path is short-circuited to the high-level side, or to the opposite side of the signal level of the PWM signal. Hence, at step s310, it is determined that the path is short-circuited to the high-level side.

Figure 6B:
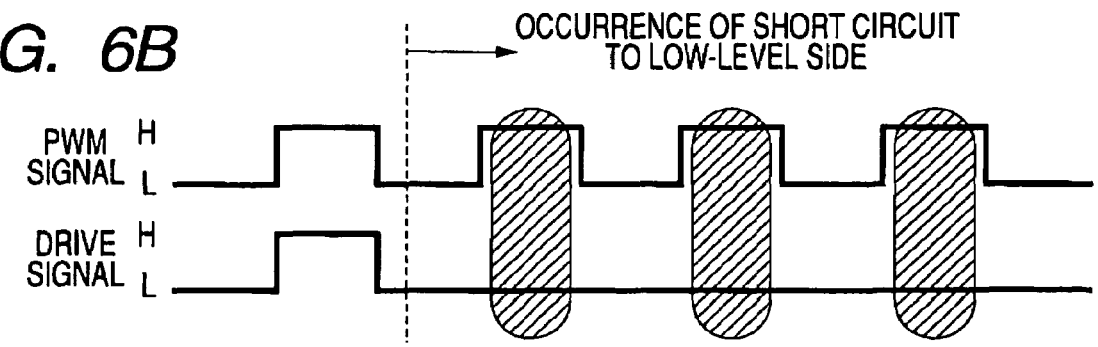
FIG. 6B is diagram showing waveforms of the PWM signal and the drive signal in the second embodiment when a short circuit to the low-level side has occurred on the path.

On the other hand, if the path 2 is short-circuited to the low-level side (to the ground side), the path 2 is fixed at the low-level side irrespective of the signal level of the PWM signal, and accordingly, the drive signal on the path 2 does not become the high level even in a period during which the PWM signal is in the high level (see the shaded areas in FIG. 6B). Accordingly, in such a state, if the duty ratio of the PWM signal is fixed at 0% at step s160, the signal levels of the PWM signal received from the control unit 10 and the drive signal PWM-modulated by the control section 22 are in relationship to be satisfied when the drive signal is normally PWM-modulated where they have the same levels. Hence, in such a state, the detector section 24 of the driver unit 20 does not detect any short circuit, and accordingly the failure information is not written into the register 28. For such reason, if the information read from the register 28 after the duty ratio of the PWM signal is fixed at 0% at step s160 is the failure information, it means that the path is short-circuited to the side of the signal level of the PWM signal, that is, to the low-level side. Hence, at step s320, it is determined that the path is short-circuited to the low-level side.

Third Embodiment

It is desirable that the load drive apparatus 1 is so configured that it can control the operation of the load apparatus 2 regardless of whether the control section 22 of the driver unit 2 functions as a low-side driver circuit or a high-side driver circuit.

Such a configuration is made possible by providing the control unit 10 with a configuration registration memory 12 (see FIG. 1) for storing information on whether the control section 22 of the driver unit 20 functions as a high-side driver circuit or a low-side driver circuit.

In this case, as shown in FIG. 7, if the information read from the register 28 is not the failure information (NO in step s170), it is checked at step s410 whether or not the information stored in the configuration registration memory 12 represents the low-side type. If the check result is affirmative, the process moves to step s180 where it is determined that the path has been short-circuited to the high-level side, and then moves to step s190. If the check result at step s410 is negative, the process moves to step s420 where it is determined that the path has been short-circuited to the low-level side, and then moves to step s190. On the other hand, if the information read from the register 28 is not the failure information (NO in step s170), it is checked at step s430 whether or not the information stored in the configuration registration memory 12 represents the low-side type. If the check result is affirmative, the process moves to step s200 where it is determined that the path has been short-circuited to the low-level side, and then moves to step s190. If the check result at step s430 is negative, the process moves to step s440 where it is determined that the path has been short-circuited to the high-level side, and then moves to step s190.

As explained above, by the provision of such a configuration registration memory 12, the load drive apparatus 1 can determine to which side the path has been short-circuited regardless of whether the control section 22 of the driver unit 20 is configured to function as a low-side type driver circuit or high-side type driver circuit.

Figure 8:
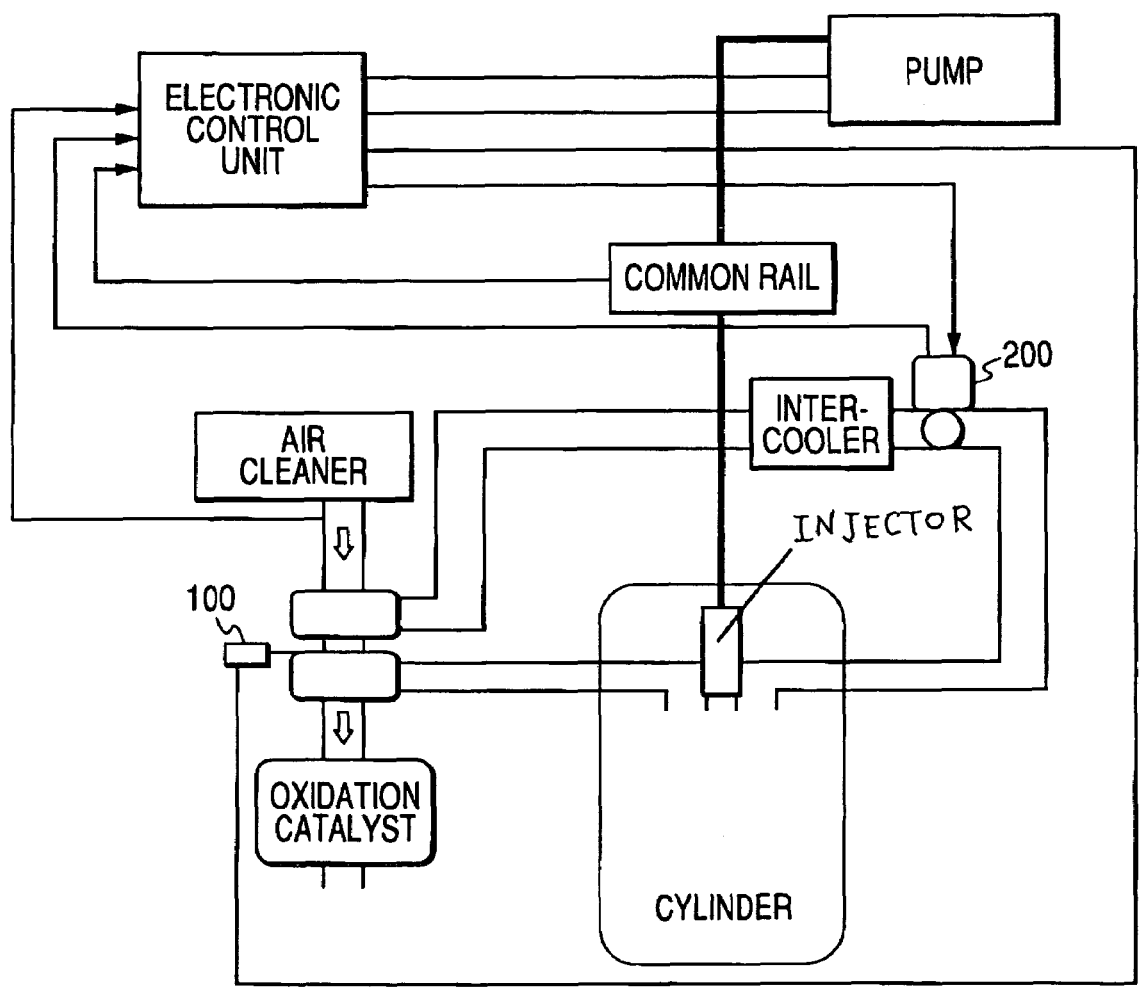
FIG. 8 is a diagram showing a turbo motor and an intake throttle valve mounted on a vehicle, which can be controlled by the load drive apparatus of the invention.

The load apparatus 2 controlled by the load drive apparatus 1 of this embodiment may be a turbo motor 100 (see FIG. 8) for suppressing turbo lag for use in a vehicle, or an intake throttle valve (vacuum switching valve) 200 (see FIG. 8) for reducing intake air for use in a vehicle.

The above explained preferred embodiments are exemplary of the invention of the present application which is described solely by the claims appended below. It should be understood that modifications of the preferred embodiments may be made as would occur to one of skill in the art.

What is claimed is:

1. A load drive apparatus comprising:
   a driver unit including:
      a control section modulating, in accordance with a PWM signal, a drive signal to be applied to a load apparatus between a high level and a low level;
      a short circuit detecting section detecting, on the basis of a signal level of said PWM signal and a signal level of said modulated drive signal, short circuit on a path through which said modulated drive signal is applied to said load apparatus; and
      a notification section making, on the basis of detection result of said short circuit detecting section, notification whose content represents presence or absence of short circuit on said path; and
   a control unit generating said PWM signal on the basis of a control program stored therein;
   wherein said control unit includes a first function of fixing a duty ratio of said PWM signal at one of 0% and 100% when content of said notification made by said notification section represents presence of short circuit on said path, and a second function of determining to which of a high-level side and a low-level side said path is short-circuited on the basis of content of notification made by said notification section after a duty ratio of said PWM signal is fixed by said first function.

2. The load drive apparatus according to claim 1, wherein said control section of said driver unit functions as a low-side type driver circuit, and said second function of said control unit determines that said path is short-circuited to a side opposite to a signal level of said PWM signal when content of notification made by said notification section represents absence of short circuit on said path after a duty ratio of said PWM signal is fixed by said first function, and to determine that said path is short-circuited to the same side as a signal level of said PWM signal when content of notification made by said notification section represents presence of short circuit on said path after a duty ratio of said PWM signal is fixed by said first function.

3. The load drive apparatus according to claim 1, wherein said control section of said driver unit functions as a high-side type driver circuit, and said second function of said control unit determines that said path is short-circuited to the same side as a signal level of said PWM signal when content of notification made by said notification section represents absence of short circuit on said path after a duty ratio of said PWM signal is fixed by said first function, and to determine that said path is short-circuited to a side opposite to a signal level of said PWM signal when content of notification made by said notification section represents presence of short circuit on said path after a duty ratio of said PWM signal is fixed by said first function.

4. The load drive apparatus according to claim 1, wherein said control unit includes a configuration registration memory storing information representing whether said control section of said driver unit functions as a high-side type driver circuit or a low-side type driver circuit.

5. The load drive apparatus according to claim 4, wherein, when said information stored in said configuration registration memory represents that said control section functions as a low-side type driver circuit, said second function of said control unit determines that said path is short-circuited to a side opposite to a signal level of said PWM signal when content of notification made by said notification section represents absence of short circuit on said path after a duty ratio of said PWM signal is fixed by said first function, and to determine that said path is short-circuited to the same side as a signal level of said PWM signal when content of notification made by said notification section represents presence of short circuit on said path after a duty ratio of said PWM signal is fixed by said first function.

6. The load drive apparatus according to claim 4, wherein, when said information stored in said configuration registration memory represents that said control section functions as a high-side type driver circuit, said second function of said control unit determines that said path is short-circuited to the same side as a signal level of said PWM signal when content of notification made by said notification section represents absence of short circuit on said path after a duty ratio of said PWM signal is fixed by said first function, and to determine that said path is short-circuited to a side opposite to a signal level of said PWM signal when content of notification made by said notification section represents presence of short circuit on said path after a duty ratio of said PWM signal is fixed by said first function.

* * * * *